United States Patent [19]
Song et al.

[11] Patent Number: 5,923,957
[45] Date of Patent: Jul. 13, 1999

[54] PROCESS FOR MANUFACTURING A LEAD-ON-CHIP SEMICONDUCTOR DEVICE PACKAGE HAVING A DISCONTINUOUS ADHESIVE LAYER FORMED FROM LIQUID ADHESIVE

[75] Inventors: Young Jae Song, Seongnam; Jeong Woo Seo; Seung Ho Ann, both of Suwon; Chan Seung Hwang, Kunpo, all of Rep. of Korea

[73] Assignee: Samsung Electronics Co., Ltd., Suwon, Rep. of Korea

[21] Appl. No.: 08/853,907

[22] Filed: May 9, 1997

[30] Foreign Application Priority Data

May 10, 1996 [KR] Rep. of Korea ...................... 96-15464

[51] Int. Cl.[6] .......................... H01L 21/56; H01L 21/58; H01L 21/60
[52] U.S. Cl. .......................... 438/118; 438/123; 438/124
[58] Field of Search .................................... 438/118, 123, 438/124

[56] References Cited

U.S. PATENT DOCUMENTS 5,086,018  2/1992  Conru et al. .
5,286,679  2/1994  Farnworth et al. .
5,358,904  10/1994  Murakami et al. .
5,714,405  2/1998  Tsubosaki et al. .

*Primary Examiner*—David Graybill
*Attorney, Agent, or Firm*—Jones & Volentine, L.L.P.

[57] ABSTRACT

A lead-on-chip semiconductor device package is formed by attaching a lead frame to the chip with a discontinuous adhesive layer. Electrode pads of the chip are electrically connected by bonding wires and mechanically connected by the adhesive layer to the lead frame, and then encapsulated by an encapsulant such as molding compound. The adhesive layer is formed from a liquid adhesive material having a certain viscosity. Although the liquid adhesive is continuously applied to top surfaces of the inner leads as well as gaps between adjacent inner leads, the adhesive layer is formed only on the top surfaces of the inner leads while the liquid adhesive falls through the gaps. Thermoplastic or thermosetting resins may be used as the liquid adhesive.

10 Claims, 7 Drawing Sheets

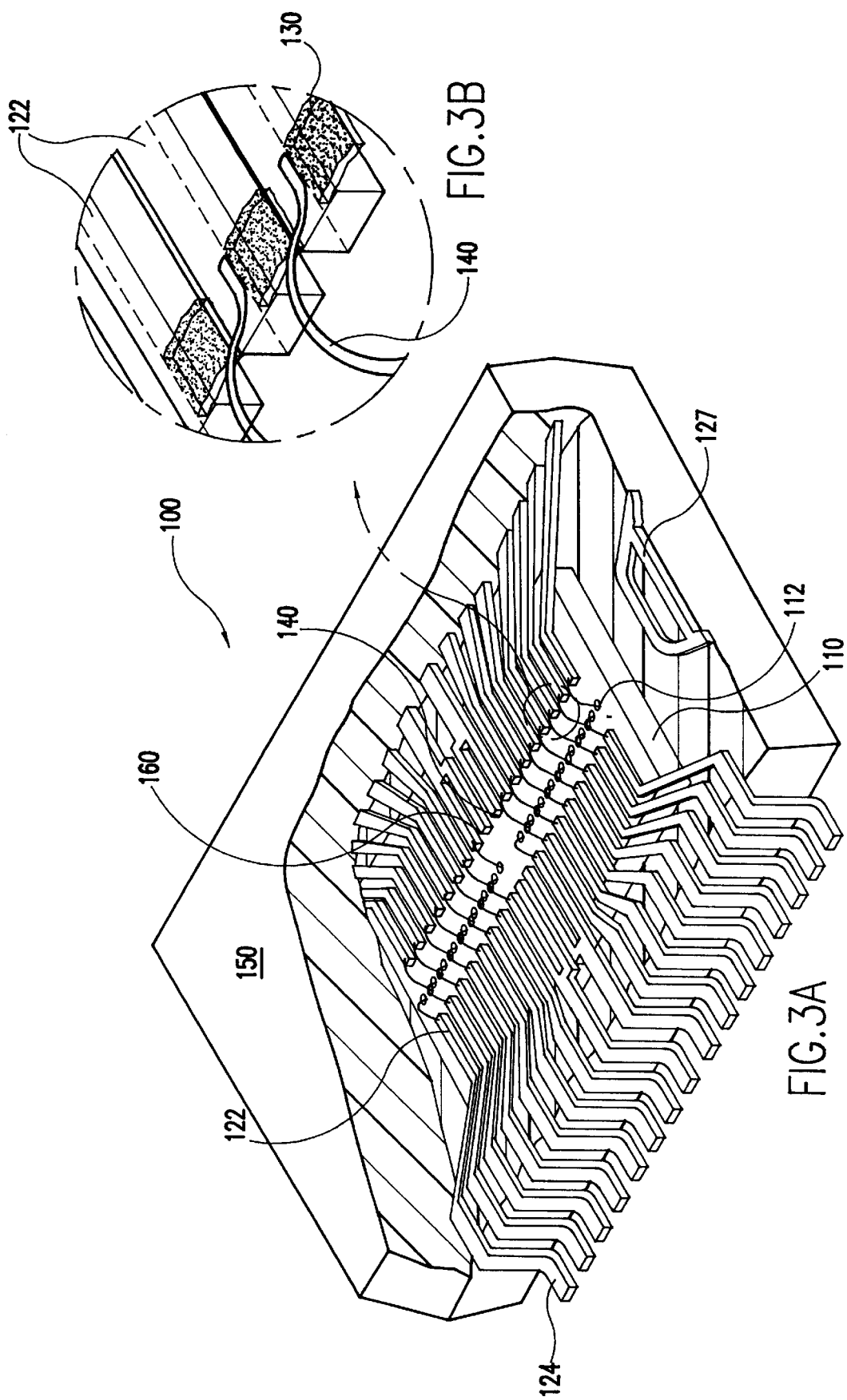

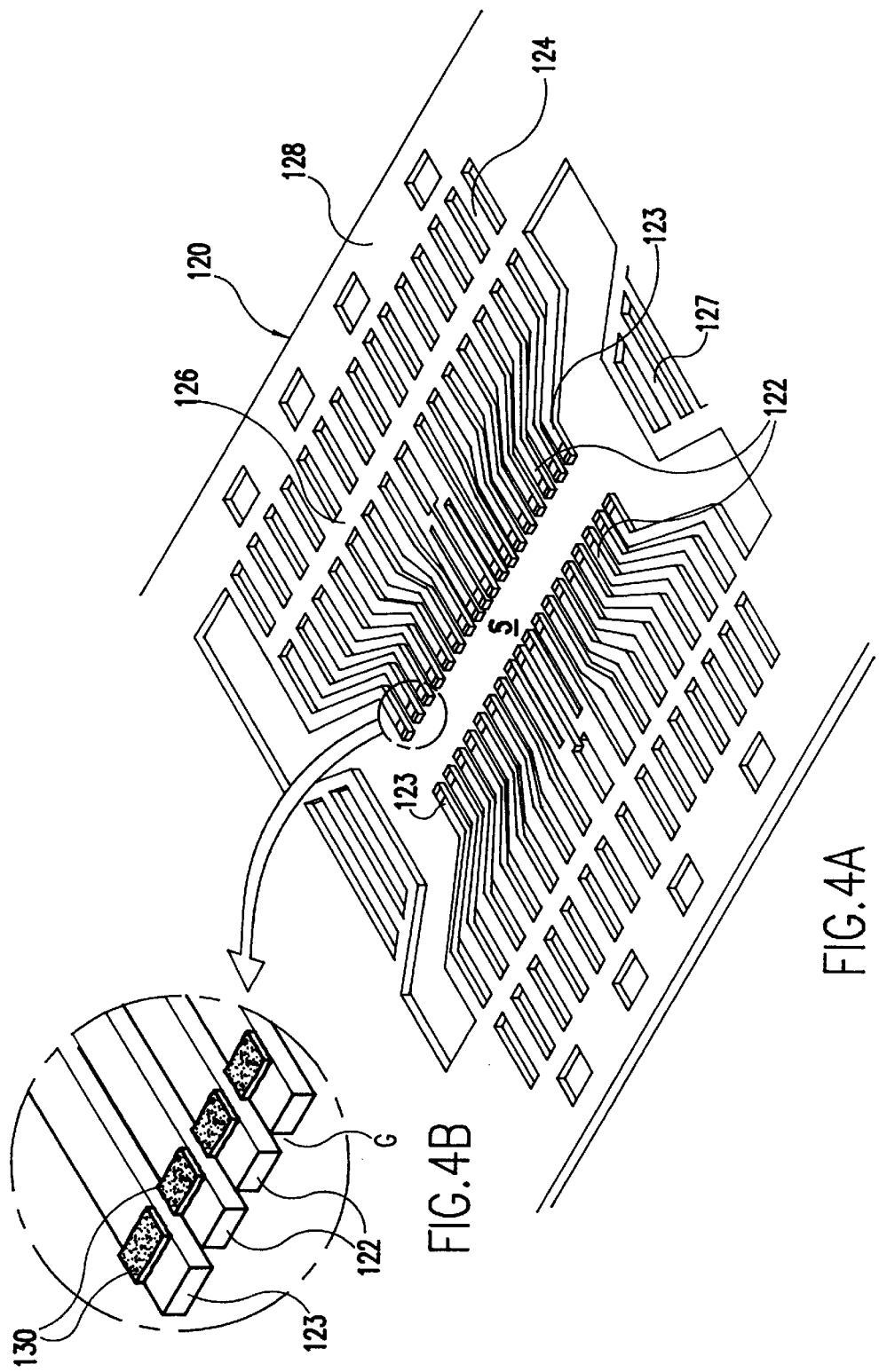

PROCESS FOR MANUFACTURING A LEAD-ON-CHIP SEMICONDUCTOR DEVICE PACKAGE HAVING A DISCONTINUOUS ADHESIVE LAYER FORMED FROM LIQUID ADHESIVE

BACKGROUND OF THE INVENTION

1. Field of the Invention

The present invention relates generally to a lead-on-chip semiconductor device package. More specifically, the present invention relates to methods and a structure utilizing a lead frame having a discontinuous adhesive layer formed from a liquid adhesive to attach a semiconductor chip to the lead frame.

2. Description of the Related Art

Even as the density of integration in semiconductor integrated circuit (IC) devices increases, the size of semiconductor chip packages needs to be smaller than ever before. To meet this need for package miniaturization various packaging technologies have been developed. One of them is the lead-on-chip (LOC) package where a plurality of leads are disposed on and attached to the active surface of a semiconductor chip.

A primary advantage of the LOC package is that a chip mounting area, also known as a die pad or a lead frame pad, is not required since the chip is attached to the leads. Accordingly, the ratio of the size of the semiconductor chip to the size of the package is quite high. Other advantages of the LOC package include lead frame design flexibility and enhanced electrical performance.

A conventional LOC semiconductor device package is depicted in FIGS. 1, 2A and 2B. FIG. 1 shows a conventional LOC package 50 in a partially cut away perspective view FIG. 2A illustrates, in an exploded perspective view, the spatial relation between a semiconductor chip 10, an adhesive tape 30, and a lead frame 20, in the LOC package 50 shown in FIG. 1 and FIG. 2B is an enlarged view of an adhesive tape portion of FIG. 2A; and.

With reference to FIGS. 1, 2A and 2B, the conventional LOC package 50 is constructed so that a plurality of inner leads 22 of the lead frame 20 are attached to an active surface of the semiconductor chip 10. Adhesion between the lead frame 20 and the semiconductor chip 10 is generally accomplished by two pieces of the adhesive tape 30. The adhesive tape 30 may comprise three layers, namely, a base film 32 and two adhesive layers 34, 36 formed respectively on each side of the base film 32. The base film 32 is typically a polyimide film and the adhesive layers 34, 36 are typically thermosetting epoxy resins layers. The semiconductor chip 10 has a plurality of electrode pads 12 which are centrally formed on the active surface. The inner leads 22 are spaced apart so that the central electrode pads 12 are exposed between the respective opposing rows of inner leads 22 on each side of the central electrode pads 12, and the inner leads 22 are electrically connected to the electrode pads 12.

Each of the inner leads 22 of the lead frame 20 is brought in close proximity to corresponding ones of the electrode pads 12, which are located along the center of the semiconductor chip 10, and thus the lead frame 20 can be electrically connected to the semiconductor chip 10 by means of short bonding wires 40.

A package body 52 is formed by encapsulants such as epoxy resins in order to protect the semiconductor chip 10, the inner leads 22, and the bonding wires 40 from hostile environments. After encapsulation, the dam bars 26 and lead frame selvage 28 shown in FIG. 2A are removed, and then the outer leads 24, which extend from the package body 52 as shown in FIG. 1, are formed into an adequate shape for surface-mounting of the package 50 onto an external system board (not shown). Tie bars 27 support the package 50 during the shape-transformation of the outer leads 24.

The assembly process of the conventional LOC package 50 is described as follows. First, a suitably sized three-layer adhesive tape 30 is positioned under the inner leads 22 of the lead frame 20, and the semiconductor chip 10 is then positioned under the three-layer adhesive tape 30. The adhesive tape 30 is attached to the inner leads 22 of the lead frame 20 by the first adhesive layer 34, and the semiconductor chip 10 is attached to the adhesive tape 30 by the second adhesive layer 36 by applying pressure to the tape 30 at a predetermined temperature. Subsequent process steps, such as wire bonding interconnection, encapsulation, and outer lead forming are successively conducted.

However, the conventional LOC package suffers some disadvantages. One problem is the structure of adhesive tape itself. Since the adhesive tape consists of three layers, four interfaces exist between the semiconductor chip 10 and the lead frame 22. The interfaces between two heterogeneous materials can produce thermomechanical stresses, and easily cause mechanical failures of the package such as cracks or delaminations. Moreover, the high water absorption property of the adhesive tape can degrade the reliability of the LOC package.

Another problem is found in the production process for the adhesive tape. The three-layer adhesive tape is made by successive sequences: adhesive materials are coated on one side of the base film 32 and cured to a so-called B-stage state (i.e., a semi-solid state), and then also coated on the other side of the base film 32 and cured. Accordingly, the tape production process is complicated and the adhesive tape is difficult to handle since it has adhesive layers on both sides thereof. Moreover, the adhesive tape contains an expensive inner polyimide film core, which consequently results in high production cost.

SUMMARY OF THE INVENTION

The present invention provides a lead-on-chip semiconductor device package with improved reliability by reducing the number of interfaces associated with adhesive tape. The present invention also provides methods for manufacturing a lead-on-chip semiconductor device package through a simple process of forming the adhesive layer by coating a liquid adhesive on a lead frame. Moreover, the lead-on-chip semiconductor device package of the present invention can be economically produced.

To achieve these and other advantages and in accordance with the purpose of the invention, as embodied and broadly described, the invention provides a lead-on-chip semiconductor device package which has a discontinuous adhesive layer formed from a liquid adhesive on a lead frame. The lead-on-chip semiconductor device package comprises a semiconductor chip with an active surface on which a plurality of electrode pads are formed. A lead frame having a plurality of inner leads and a plurality of outer leads are arranged in opposing rows and placed over the active surface of the semiconductor chip so that the electrode pads are exposed through a space defined between the opposing rows of the plurality of inner leads. A single adhesive layer is positioned between the active surface of the semiconductor chip and the plurality of inner leads of the lead frame for attaching the lead frame to the active surface of the semiconductor chip. The adhesive layer has a certain viscosity and is discontinuous in that the adhesive layer is formed on the inner leads, but the adhesive layer does not bridge a gap defined between adjacent of the inner leads. A plurality of bonding wires electrically interconnect respective of the plurality of electrode pads to respective of the plurality of inner leads of the lead frame. An encapsulant protects the semiconductor chip, adhesive layer, plurality of inner leads of lead frame, and plurality of bonding wires.

In another aspect, the present invention provides a method for manufacturing a lead-on-chip semiconductor device package, comprising steps of: preparing a semiconductor chip and a lead frame, the semiconductor chip having an active surface on which a plurality of electrode pads are formed, and the lead frame having a plurality of inner leads and a plurality of outer leads; continuously applying a liquid adhesive having a certain viscosity along a top surface of the plurality of inner leads of the lead frame; forming an adhesive layer on the top surfaces of the inner leads, while allowing the liquid adhesive to drip down through gaps formed between adjacent of the inner leads; attaching the plurality of inner leads of the lead frame to the active surface of the semiconductor chip by means of the adhesive layer, whereby the adhesive layer is positioned between the semiconductor chip and the lead frame, and the plurality of electrode pads of the semiconductor chip are exposed through a space defined between opposing rows of the plurality of inner leads; electrically interconnecting respective of the plurality of electrode pads of the semiconductor chip to respective of the plurality of inner leads of the lead frame using a bonding wire; and encapsulating the semiconductor chip, the adhesive layer, the plurality of inner leads of the lead frame, and the bonding wire, with an encapsulant.

In still another aspect, the method may be modified to provide a joint bar for joining respective tips of the plurality of inner leads, the joint bar being formed perpendicular to the inner leads. A liquid adhesive having a certain viscosity is continuously applied along a top surface of the joint bar of the lead frame to form an adhesive layer on the joint bar. Portions of the joint bar corresponding to gaps defined between adjacent of the plurality inner leads are removed, whereby the adhesive layer is arranged only on the top surface of the inner leads.

BRIEF DESCRIPTION OF THE DRAWINGS

These and various other features and advantages of the present invention will become better understood with regard to the following detailed description and accompanying drawings where:

FIG. 3A is a partially cut away perspective view of one embodiment of a lead-on-chip semiconductor device package in accordance with the present invention;

FIG. 3B is an enlarged view of a lead portion of FIG. 3A;

FIG. 4A is a perspective view of a lead frame, which is employed in the package of FIG. 3A, having an adhesive layer discontinuously formed from a liquid adhesive;

FIG. 4B is an enlarged view of a lead portion of FIG. 4A;

DETAILED DESCRIPTION OF THE PRESENT INVENTION

Figure 1:
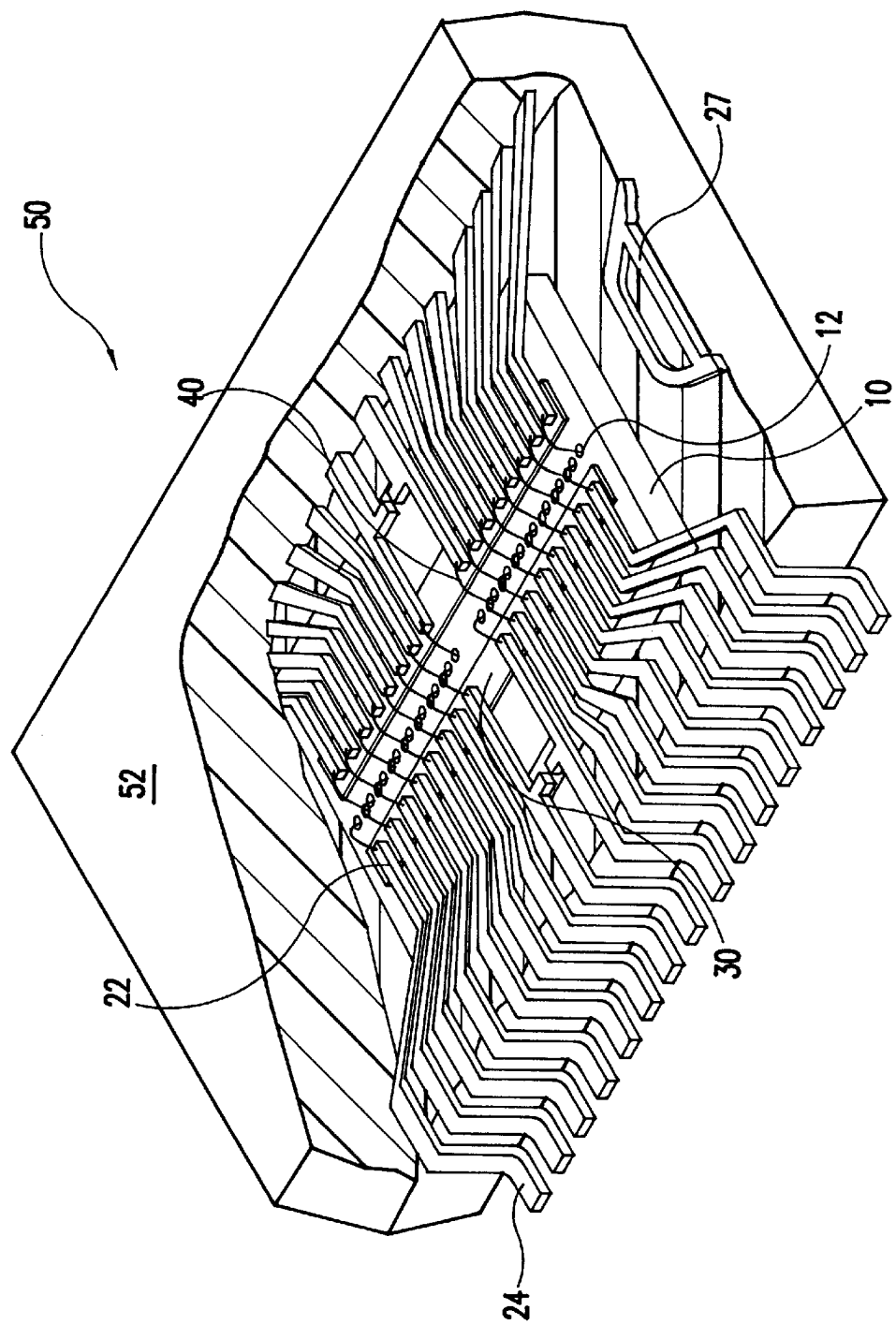
FIG. 1 is a partially cut away perspective view of a conventional lead-on-chip semiconductor device package.
Figures 2A, 2B:
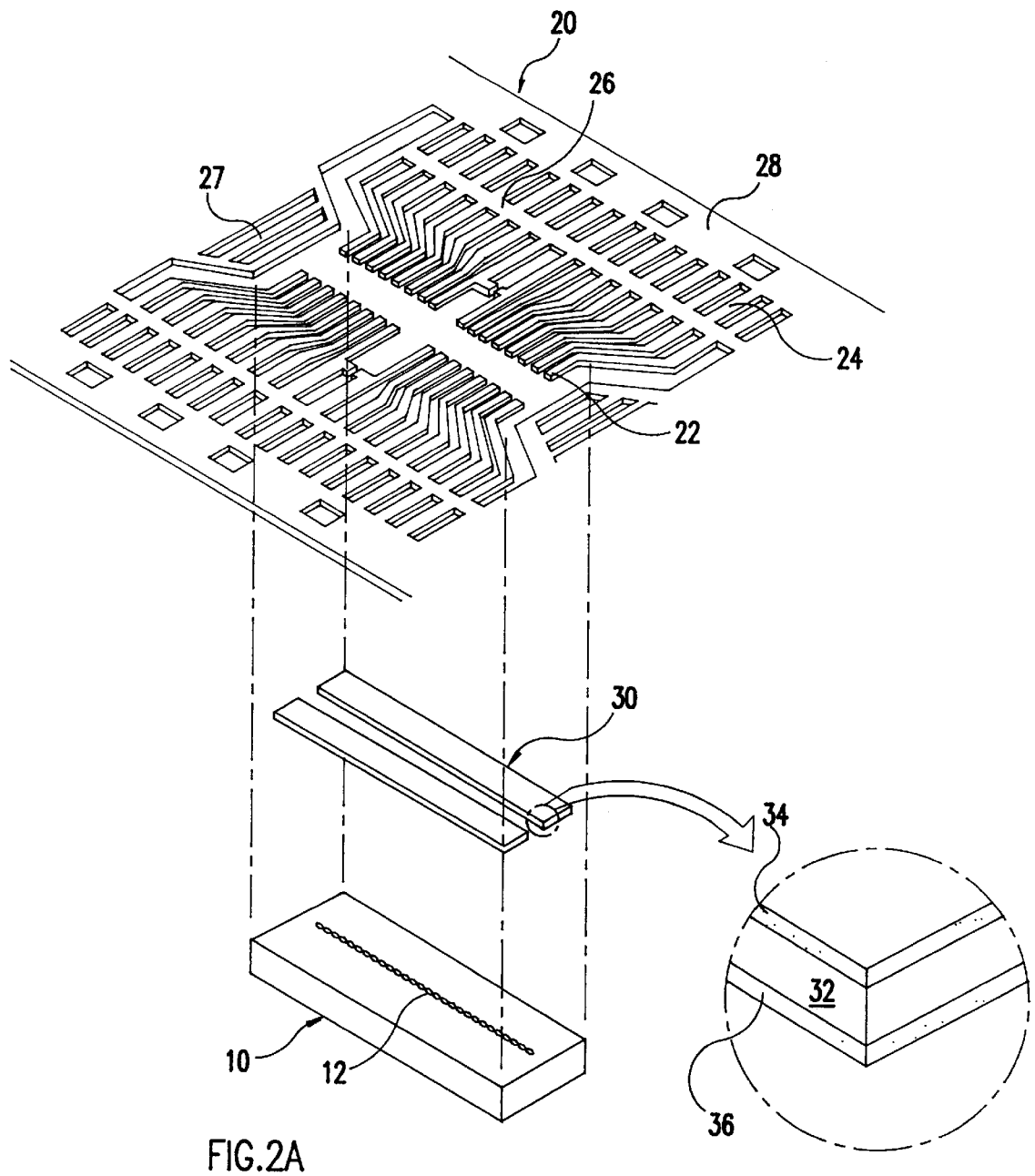
FIG. 2A is an exploded perspective view illustrating the spatial relation between a semiconductor chip, an adhesive tape, and a lead frame, in the package shown in FIG. 1.
FIG. 2B is an enlarged view of an adhesive tape portion of FIG. 2A.

The present invention will now be described in more detail with reference to accompanying drawings.

FIG. 3A is a cut away perspective view of one embodiment of a lead-on-chip (LOC) semiconductor device package 100 in accordance with the present invention, FIG. 3B is an enlarged view of a lead portion of FIG. 3A, and FIG. 4A is a perspective view of a lead frame 120 employed in the package 100 of FIG. 3A, having an adhesive, and FIG. 4B is an enlarged view of a lead portion of FIG. 4A layer 130 discontinuously formed from a liquid adhesive.

The LOC semiconductor device package 100 has a structure where a plurality of inner leads 122 of the lead frame 120 are attached to an active surface of a semiconductor chip 110. The attachment between the semiconductor chip 110 and the lead frame 120 is accomplished by the single adhesive layer 130 instead of the conventional three-layer adhesive tape. The semiconductor chip 110 has a plurality of electrode pads 112 which are formed on the active surface of the semiconductor chip 110. The electrode pads 112 are preferably, but not necessarily, formed at a central part of the active surface. Because the electrode pads 112 of the semiconductor chip 110 should be electrically interconnected to the inner leads 122 of the lead frame 120 after the attaching the semiconductor chip 110 and the lead frame 120, the inner leads 122 are disposed so that the electrode pads 112 are exposed through the space S between the opposing rows of inner leads 122.

The electrical interconnection between the semiconductor chip 110 and the lead frame 120 is accomplished by using bonding wires 140. The semiconductor chip 110, the adhesive layer 130, the inner leads 122 of the lead frame 120, and the bonding wires 140 are encapsulated with an encapsulant such as epoxy molding compounds to form a package body 150, which provides protection from hostile environments. After the encapsulation is completed, the dam bars 126 and lead frame selvage 128 shown in FIG. 4A are removed, and then outer leads 124, which are shown in FIG. 3A and extend from the package body 150, are formed into an adequate shape for surface-mounting onto an external system board (not shown). The dam bars 126, which are located across the inner leads 122 and the outer leads 124, impart some rigidity to the lead frame 120 and prevent overflow of the encapsulant such as epoxy molding compound during encapsulation. Tie bars 127, which still remain inside the package body 150, support the package 100 during the shape-transformation of the outer leads 124. Reference numeral 123 in FIG. 4A and 4B designates the outermost inner leads, which will be described in detail later.

In the present invention, therefore, the adhesive layer 130 is used to attach the lead frame 120 to the semiconductor chip 110. The single adhesive layer 130 is formed from a liquid adhesive 132 having a certain viscosity. The liquid adhesive 132 is continuously applied to the inner leads 122 of the lead frame 120 and then cured, i.e., heat-treated. The resulting adhesive layer 130 is formed on each of the inner leads 122, but the adhesive layer 130 is discontinuous in that there is no liquid adhesive 132 bridging the gap G between adjacent inner leads 122 as shown in FIG. 4A. That is, there is no adhesive between the inner leads 122.

Figure 5:
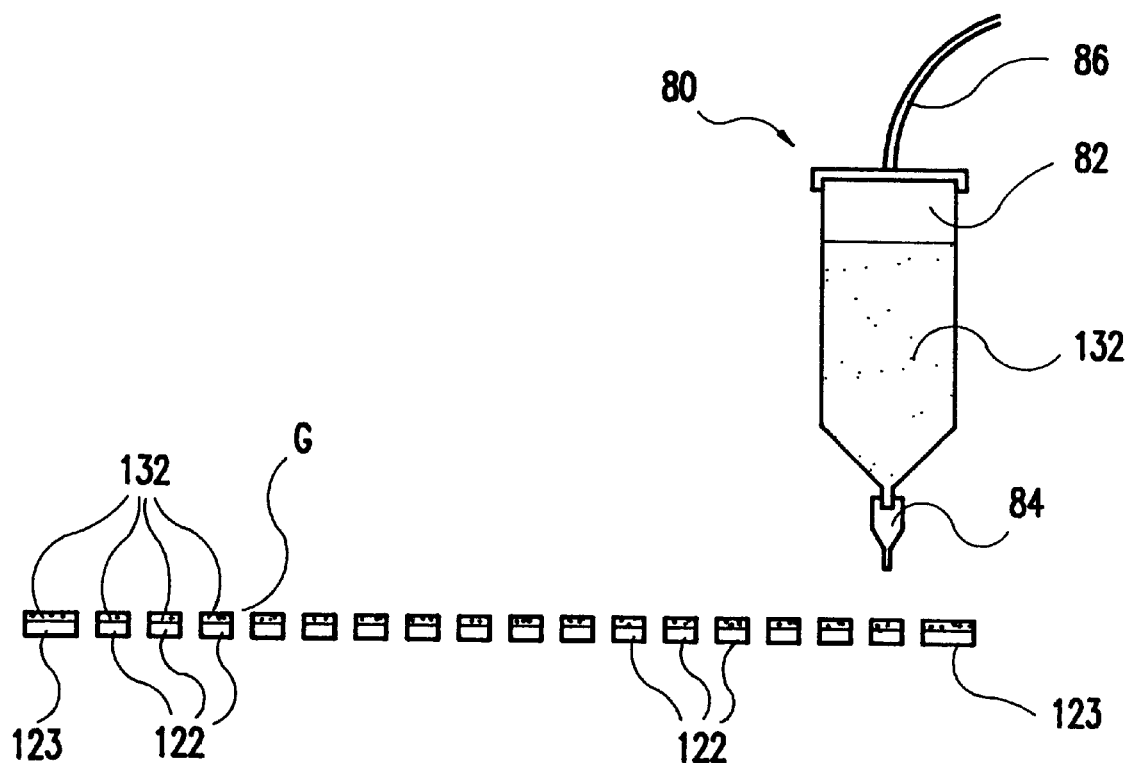
FIG. 5 is a schematic view showing a process of applying the liquid adhesive to the lead frame to produce the adhesive layer of FIG. 4B.

FIG. 5 shows a process of applying the liquid adhesive 132 to the inner leads 122 for forming the adhesive layer 130 of FIG. 4B. Referring to FIGS. 4B and 5, the liquid adhesive 132 is applied to the inner leads 122 by using a means for applying 80 as shown in FIG. 5, and then is turned into the discontinuous B-stage (i.e., a semi-solid state) adhesive layer 130 of FIG. 4 after a curing step. Both thermoplastic resins and thermosetting resins that are electrically non-conductive can be employed as the adhesive 132, but thermoplastic resins such as polyether amid, polyimide siloxane, and polyimide are mainly used since they are easy to handle and may be reworked if necessary.

The adhesive 132 remains in a liquid state and has a range of viscosity such that it spontaneously drips or falls through the gap G between the inner leads 122, while still remaining on the top surface of the inner leads 122.

The means for applying 80, such as the dispenser shown in FIG. 5, is preferably used to apply the liquid adhesive 132 along the top surfaces of the inner leads 122. The dispenser 80 comprises a syringe 82 which holds the liquid adhesive 132, a nozzle 84 which is used as a means for dispensing the liquid adhesive 132 from the syringe 82, and a pressure tube 86 which is used for applying a pressure to the liquid adhesive 132. Additionally, a moving mechanism (not shown) may be coupled to the dispenser 80 to move the dispenser 80 in a direction perpendicular to the inner leads 122. When a certain pressure is applied through the pressure tube 86 to the liquid adhesive 132 held in the syringe 82, the inner leads 122 are coated with the liquid adhesive 132 as the moving mechanism moves the dispenser 80 at a uniform velocity.

The inner leads 122 need not be disposed at the same interval, even though a standard interval is preferred for uniform coating. The outermost inner leads 123, however, should have a larger width than the width of the inner lead 122. This is because when a liquid adhesive 132 is applied to the inner leads 122 by means of the dispenser 80, the thickness of the applied liquid adhesive 132 may be uneven at the both starting and ending points due to differences in the dispensing velocity of the dispenser 80 and the consistency or viscosity of the liquid adhesive 132. Accordingly, the outermost inner leads 123 are adjacently arranged at one or both of the starting and ending points of the liquid adhesive application process. The outermost inner leads 123 should have a larger width than the other inner leads 122 to accomplish a uniform thickness across the inner leads 122.

In addition, dummy leads 160 (see FIG. 3A), which are not interconnected to the semiconductor chip 110, are arranged at central portions along the row of inner leads 122 so that all the inner leads 122 have the same interval to ensure uniform bonding across the chip and lead interface.

Figure 6:
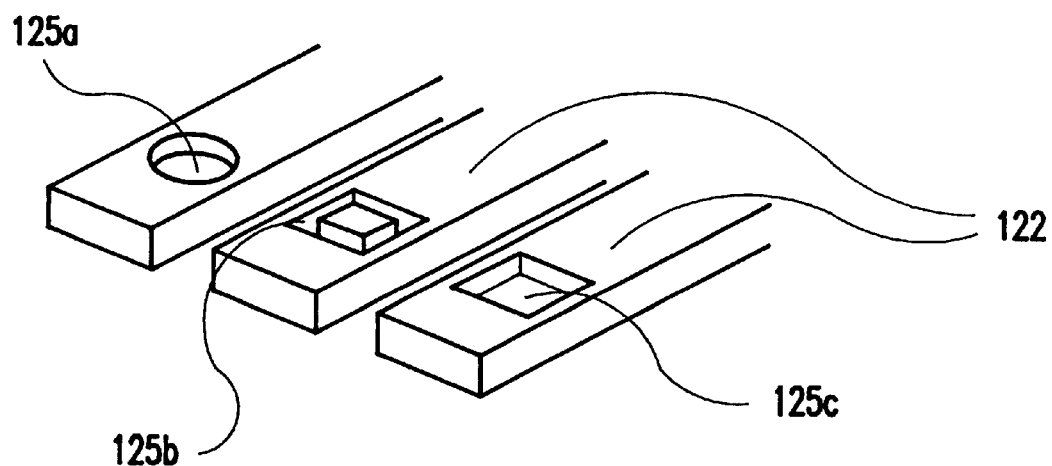
FIG. 6 is a partial perspective view showing various depressions formed on the surfaces of the inner leads of the lead frame shown in FIG. 4B.

Even though the liquid adhesive 132 may have a suitable viscosity, the liquid adhesive 132 on the top surface of the leads 122 may at times also drip down through the gap G between the leads 122. Therefore, the inner leads 122 may be provided with various depressions on the surface to which the adhesive 132 is applied. In FIG. 6 there are shown various circular 125a, grooved 125b and square 125c shaped on the top surfaces of the inner leads 122. Such depressions 125a, 125b and 125c may be made by ordinary lead frame producing methods, for example, etching or stamping methods.

As stated previously, the liquid adhesive 132 applied to the inner leads 122 is changed into the B-stage adhesive layer 130 after a curing step. In the case where thermoplastic resins are used, the cure step is conducted at a temperature of about 200° C. When thermosetting resins are used, the temperature of cure step is about 150° C.

Figure 7:
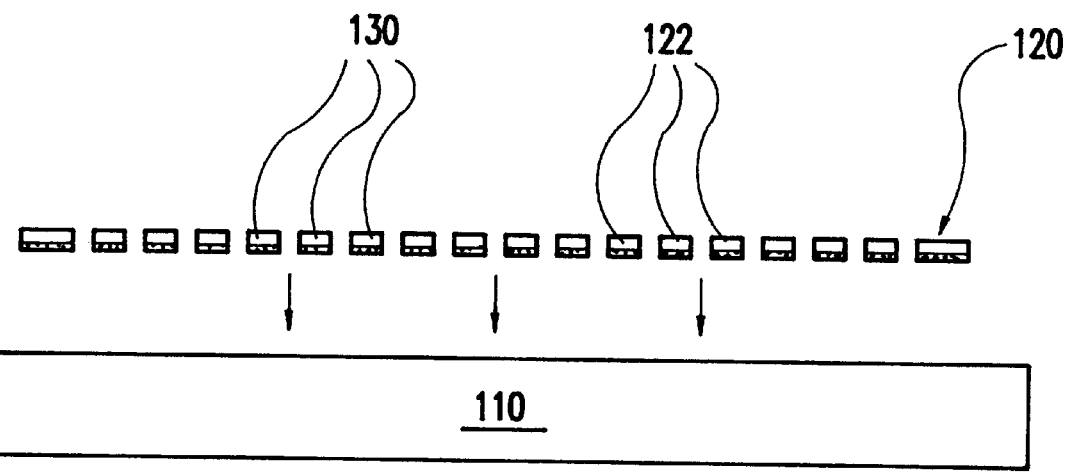
FIG. 7 is a schematic view showing a process of attaching a semiconductor chip to the lead frame of FIG. 4B having the discontinuous adhesive layer.

After the cure step, the chip attachment step is performed using a thermocompressing method as shown in FIG. 7. As shown in FIG. 7, the lead frame 120 having the B-stage adhesive layer 130 is arranged over the active surface of the semiconductor chip 110 and attached to the chip 110 using the thermocompression method. This chip attachment step is conducted at the temperature of about 400° C. for thermoplastic resins and about 200° C. for thermosetting resins. The thermoplastic resins need to be cured at a higher temperature in the chip attachment step than the thermosetting resins since the former has a higher glass transition temperature (Tg). The lead frame in FIG. 4B shows the cured adhesive layer 130 and the LOC package in FIG. 3A shows the lead frame completely attached to the semiconductor chip 110.

Since the adhesive layer 130 has a single layer instead of the three layers found in conventional adhesive tape, a lead-on-chip semiconductor device package with improved reliability can be obtained by reducing the number of interfaces between the inner leads 122 and the chip 110. Furthermore, since the adhesive layer 130 is formed through a simple application step, it reduces production costs. Moreover, the potential for poor reliability caused by the cutting of the adhesive tape can be eliminated.

Figure 8A:
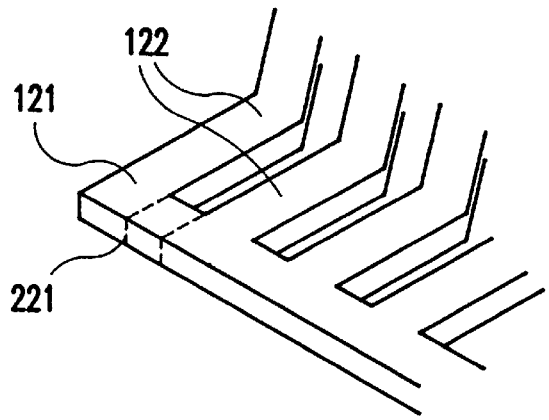
FIGS. 8a, 8b and 8c are partial perspective views showing another process of forming the discontinuous adhesive layer of FIG. 4B.
Figure 8B:
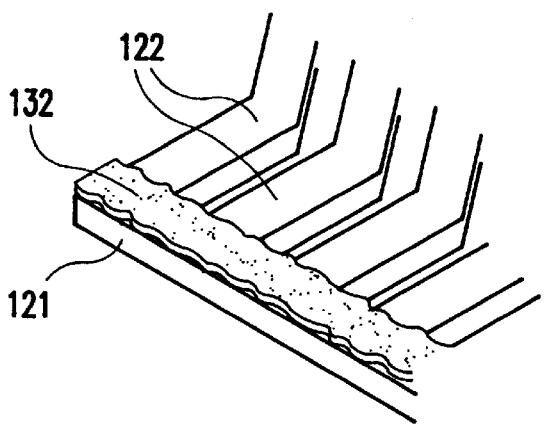
Figure 8C:
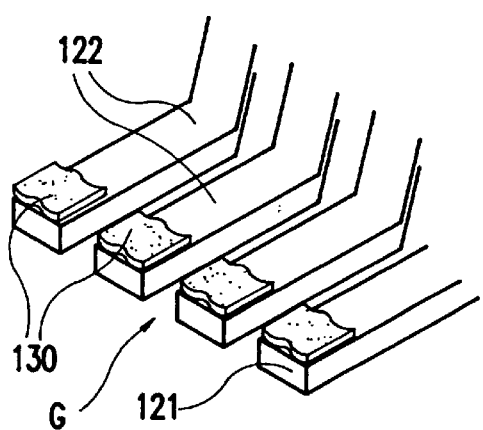

The adhesive layer 130 of the present invention may be formed by another method as illustrated in FIGS. 8a, 8b and 8c, which are partial perspective views for explaining another process of forming the discontinuous adhesive layer 130 of FIG. 4B. As shown in FIGS. 8a through 8c, a joint bar 121 joins the tips of the inner leads 122 and is formed in a perpendicular direction to the inner leads 122 (FIG. 8a). Next, the liquid adhesive 132 is applied to the surface of the joint bar 121 and then changed into the adhesive layer 130 (not shown) after a curing step as in the previous method (FIG. 8b). Then, the parts of the joint bar 121 corresponding to the gaps G between the inner leads 122 are removed, and the adhesive layer 130 is formed on the inner leads 122 (FIG. 8c). Depressions 221 (FIG. 8a), such as grooves or notches, may be formed at the part of the joint bar 121 to be removed to facilitate separation.

The present invention has several advantageous features. One is that the number of adhesive layer interfaces is reduced and the reliability is improved because the lead-on-chip semiconductor device package has a single adhesive layer. Another advantage is that the adhesive layer is easily produced through a simple process in which the liquid adhesive is applied to the inner leads of the lead frame and then cured. As a result, the present invention provides a lead-on-chip semiconductor device package with a simple manufacturing process, a lower production cost, and an improved reliability.

Although the present invention has been described in detail with reference to certain preferred embodiments thereof, other embodiments are possible. For example, screen-printing or spraying methods are possible methods for applying the liquid adhesive. Therefore, the spirit and scope of the appended claims should not be limited to the description of the preferred embodiments contained herein.

We claim:

1. A method for manufacturing a lead-on-chip semiconductor device package, comprising steps of:

preparing a semiconductor chip and a lead frame, said semiconductor chip having an active surface on which a plurality of electrode pads are formed, and said lead frame having a plurality of inner leads and a plurality of outer leads;

continuously applying a liquid adhesive having a certain viscosity along a top surface of said plurality of inner leads of said lead frame;

forming an adhesive layer on the top surfaces of the inner leads, while allowing said liquid adhesive to drip down through gaps formed between adjacent of said inner leads;

attaching said plurality of inner leads of said lead frame to said active surface of said semiconductor chip by means of said adhesive layer, whereby said adhesive layer is positioned between said semiconductor chip and said lead frame, and said plurality of electrode pads of said semiconductor chip are exposed through a space defined between opposing rows of said plurality of inner leads;

electrically interconnecting respective of said plurality of electrode pads of said semiconductor chip to respective of said plurality of inner leads of said lead frame using a bonding wire; and encapsulating said semiconductor chip, said adhesive layer, said plurality of inner leads of said lead frame, and said bonding wire, with an encapsulant.

2. The method of claim 1, wherein said forming step includes a step of curing said liquid adhesive remaining on the top surfaces of said inner leads.

3. The method of claim 1, wherein said liquid adhesive is a thermoplastic resin.

4. The method of claim 3, wherein the thermoplastic resin is selected from the group consisting of polyether amid, polyimide siloxane, and polyimide.

5. The method of claim 3, wherein said curing step is carried out at a temperature of about 200° C.

6. The method of claim 3, wherein said attaching step includes a step of thermocompressing said adhesive layer at a temperature of about 400° C.

7. The method of claim 2, wherein said liquid adhesive is a thermosetting resin.

8. The method of claim 7, wherein said curing step is carried out at a temperature of about 150° C.

9. The method of claim 7, wherein said attaching step includes a step of thermocompressing said adhesive layer at a temperature of about 200° C.

10. A method for manufacturing a lead-on-chip semiconductor device package, comprising steps of:

preparing a semiconductor chip and a lead frame, said semiconductor chip having an active surface on which a plurality of electrode pads are formed, said lead frame having a plurality of inner leads, a plurality of outer leads, and a joint bar for joining respective tips of said plurality of inner leads, said joint bar being formed perpendicular to said inner leads;

continuously applying a liquid adhesive having a certain viscosity along a top surface of said joint bar of said lead frame;

forming an adhesive layer on said joint bar;

removing portions of said joint bar corresponding to gaps defined between adjacent of said plurality inner leads, whereby said adhesive layer is arranged only on the top surface of the inner leads;

attaching said plurality of inner leads of said lead frame to said active surface of said semiconductor chip by means of said adhesive layer, whereby said adhesive layer is positioned between said semiconductor chip and said lead frame, and said plurality of electrode pads of said semiconductor chip are exposed through a space defined between opposing rows of said plurality of inner leads;

electrically interconnecting respective of said plurality of electrode pads of said semiconductor chip to respective of said plurality of inner leads of said lead frame using a bonding wire; and encapsulating said semiconductor chip, said adhesive layer, said plurality of inner leads of said lead frame, and said bonding wire, with an encapsulant.

* * * * *